(12) United States Patent
Boehland et al.

(10) Patent No.: US 8,794,806 B2
(45) Date of Patent: Aug. 5, 2014

(54) LIGHT MODULE

(75) Inventors: Heiko Boehland, Berlin (DE); Olaf Runge, Berlin (DE); Guido Renner, Weinheim (DE)

(73) Assignee: Carl Freudenberg KG, Weinheim (DE)

( * ) Notice: Subject to any disclaimer, the term of this patent is extended or adjusted under 35 U.S.C. 154(b) by 136 days.

(21) Appl. No.: 13/275,344

(22) Filed: Oct. 18, 2011

(65) Prior Publication Data
US 2012/0099335 A1    Apr. 26, 2012

(30) Foreign Application Priority Data

Oct. 20, 2010 (DE) .......................... 10 2010 048 801

(51) Int. Cl.
*B60Q 1/26* (2006.01)
*B60R 1/12* (2006.01)
(52) U.S. Cl.
USPC .......................................... 362/494; 362/545
(58) Field of Classification Search
USPC .......................................... 362/494, 543–545
See application file for complete search history.

(56) References Cited

U.S. PATENT DOCUMENTS

| | | | |
|---|---|---|---|
| 6,657,767 B2 * | 12/2003 | Bonardi et al. | 359/265 |
| 7,334,922 B2 | 2/2008 | Bonardi et al. | |
| 7,513,664 B2 * | 4/2009 | Chou | 362/494 |
| 2005/0201113 A1 | 9/2005 | Tuttle et al. | |

FOREIGN PATENT DOCUMENTS

WO    WO 2004024502 A2    3/2004

* cited by examiner

*Primary Examiner* — Jason Moon Han
(74) *Attorney, Agent, or Firm* — Leydig, Voit & Mayer, Ltd.

(57) ABSTRACT

A light module for displaying a signal in a rearview mirror of a motor vehicle includes a circuit carrier, at least one light source disposed on the circuit carrier and a power supply circuit. The power supply circuit is for connecting the circuit carrier to an interface that is disposed at a distance from the circuit carrier and that leads to at least one of a control unit and a current or voltage source. The power supply circuit and circuit carrier are made of the same material, are configured in one piece and are formed by a flexible printed circuit board.

17 Claims, 5 Drawing Sheets

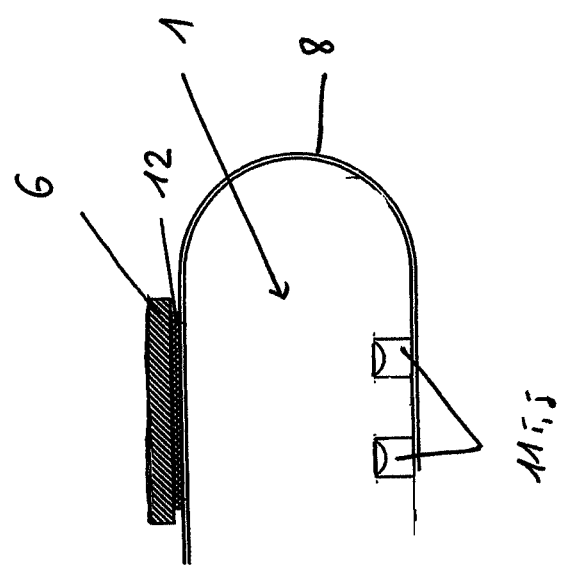

LIGHT MODULE

CROSS REFERENCE TO RELATED APPLICATIONS

This application claims priority to German Patent Application No. DE 10 2010 048 801.1, filed Oct. 20, 2010, which is hereby incorporated by reference herein in its entirety.

FIELD OF THE INVENTION

The invention relates to a light module to display a signal in the rearview mirror of a motor vehicle, comprising a circuit carrier on which at least one light source and, optionally, additional electronic components, are arranged, and a power supply circuit for connecting the circuit carrier to an interface that is arranged at a distance from the circuit carrier and that leads to connection means to establish a connection to a source of current/voltage and/or to a control unit.

BACKGROUND

A light module for displaying a signal in a rearview mirror is described in international patent application WO 2004/024502 A1. The light module, which is arranged on the back of the mirror glass of a rearview mirror of a motor vehicle, consists of a rigid circuit board that is fitted with LEDs on the side facing the back of the mirror glass. This publication puts forward cables in order to connect the circuit board to a current/voltage supply or to a control unit. The LEDs serve to display differently lit symbols in the surface of the mirror glass in order to indicate special driving or ambient situations of the vehicle such as, for example, an activated turn signal, an approaching vehicle in the blind spot, etc.

A drawback of the prior-art light module is that its structure is very complex and requires a great deal of installation space.

SUMMARY

An aspect of the present invention is to refine a light module of the above-mentioned type in such a way that it is easy and cost-effective to produce and takes up little installation space.

In an embodiment, the present invention provides a light module for displaying a signal in a rearview mirror of a motor vehicle including a circuit carrier, at least one light source disposed on the circuit carrier and a power supply circuit. The power supply circuit is for connecting the circuit carrier to an interface that is disposed at a distance from the circuit carrier and that leads to at least one of a control unit and a current or voltage source. The power supply circuit and circuit carrier are made of the same material, are configured in one piece and are formed by a flexible printed circuit board.

BRIEF DESCRIPTION OF THE DRAWINGS

Embodiments of the present invention are described in the following with reference to the drawings, in which:

FIG. 5 shows a schematic depiction in a side view of a light module integrated into a heating film according to another embodiment of the invention.

DETAILED DESCRIPTION

Figure 1:
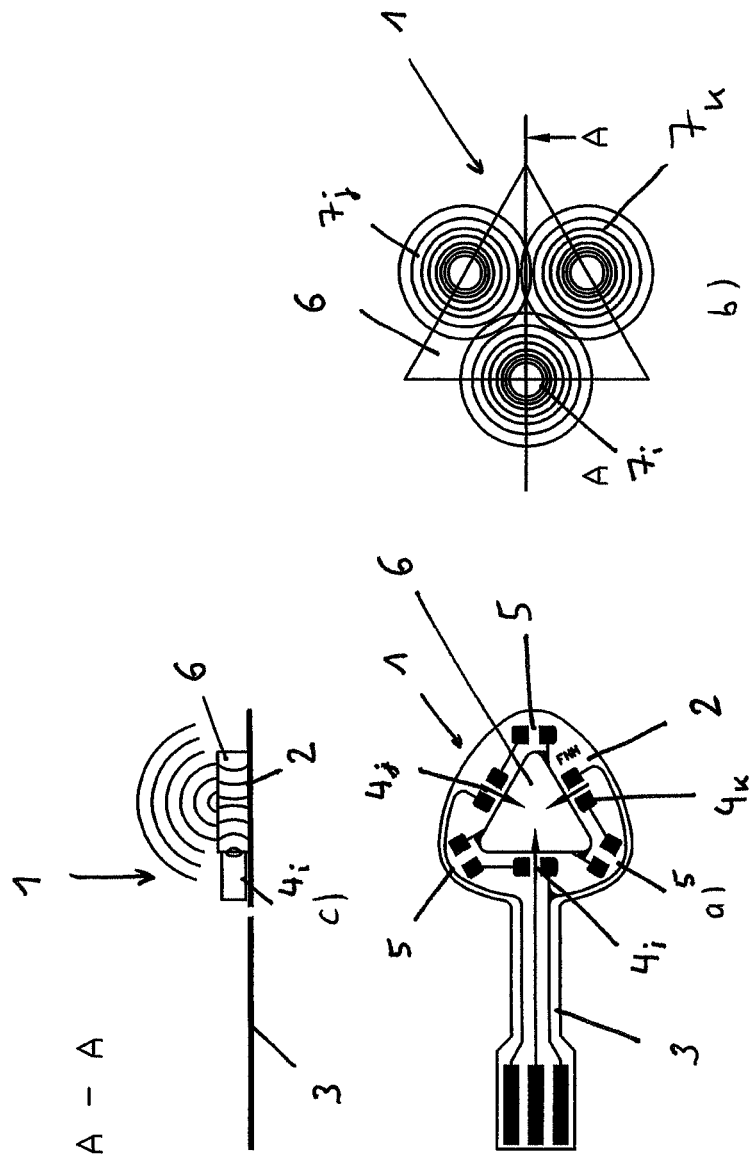
FIGS. 1a, 1b and 1c show a schematic depiction of a light module according to a preferred embodiment of the invention in various views.

A light module according to an embodiment of the invention, for displaying a signal in the rearview mirror of a motor vehicle comprises a circuit carrier on which at least one light source and, optionally, additional electronic components are arranged, and a power supply circuit for connecting the circuit carrier to an interface that is arranged at a distance from the circuit carrier and that leads to connection means to establish a connection to a source of current/voltage and/or to a control unit. With a light module of the above-mentioned type, it is provided that the circuit carrier and the power supply circuit are made of the same material and configured in one piece, and they are formed by a flexible printed circuit board.

In an embodiment, the light module includes a circuit carrier and an interface leading to the power supply or to a control unit that are physically separate from each other. Since current connections to the circuit carrier itself are eliminated, fewer components are needed and the light module can be configured with a relatively small volume, so that it only takes up little installation space and is easy to mount. This also reduces the costs.

In a preferred embodiment of the invention, the light sources are SIDE LEDs and/or TOP LEDs. They can emit white and/or colored light. In particular, the luminous surface can also be lit in several colors in order to generate the desired signals.

Advantageously, the arrangement of the light sources on the circuit carrier can be adapted to the contour of the surface that is to be lit.

In order to set the radiation angle of the light, at least one light-forming element can be provided. The light-forming element, which has the function of directing the light coming from the light sources to the passenger compartment, can be formed, for example, by a simple optical waveguide. However, it is also conceivable to use other optical elements that can be used to influence the beam path of the light.

Advantageously, the circuit carrier, the light sources, the optionally present additional electronic components and the light-forming element can have a flat, sandwich-like structure. In this embodiment, the installation space needed is particularly small, the module is easy to handle and to accommodate.

In another preferred embodiment of the invention, the light-forming element is arranged in such a manner that the circuit carrier with the light sources and the optionally present additional electronic components are sealed towards the outside. In this manner, the electronic components are protected, for example, against the penetration of dust and other dirt, without additional components being needed for this purpose. The individual components can additionally be glued together.

In order to uniformly illuminate the surface that is to be lit, in a generally known manner, a diffuser, especially a diffuser film, can be provided.

By the same token, masks can be provided to generate desired symbols in the surface that is to be lit.

According to another preferred embodiment of the invention, the flexible printed circuit board is configured as a strip-shaped printed conductor installed in the area of the power supply circuit.

The circuit carrier can also be integrated into a flexible printed circuit board that serves to provide other extra functions such as, for example, a heating function and/or an antenna function or another light function. In this case, the power supply circuit or the contact to a control unit is established via the flexible printed circuit board. Here, the circuit carrier only has to be positioned with the light sources in such a way that, once the light sources are mounted, they are visible in the rearview mirror through a signal window of the rearview mirror.

However, the circuit carrier can also be arranged on the outer edge of the flexible printed circuit board in such a way that, during the mounting, it can be brought into the area of the signal display window of the rearview mirror by folding or bending the strip-shaped printed conductor over toward the inside. For this purpose, the light module can project, for example, towards the outside away from the edge of the flexible printed circuit board. Here, the strip-shaped printed conductor can be configured in one piece and can be made of the same material as the flexible printed circuit board. However, it is also possible to provide an interface between the light module and the flexible printed circuit board.

With this embodiment as well, the circuit carrier with the light sources is positioned in such a way that, when in the mounted state, the light sources are visible through a signal display window of the rearview mirror. For this purpose, the flexible printed circuit board can have, for instance, an appropriate recess. In the case of a sandwich-like structure, the circuit carrier can be folded directly against the signal window. However, it can also be arranged at a distance, whereby the diffuser and the light-forming element can be provided in the area of the signal window.

A light module according to an embodiment of the invention is preferably used to display signals in a rearview mirror of a motor vehicle. It can be arranged in the mirror glass surface as well as in the area of the mirror base.

Preferably, it is used to display the blind spot. However, it is by no means restricted to this type of display. There are no limitations when it comes to the application possibilities. In spite of its simple structure with the smallest possible number of components, any kind of symbols can be shown in any color.

A light module 1 according to a preferred embodiment of the invention can be seen in FIG. 1. The light module 1 is configured as a separate component, without this constituting a restriction. FIG. 1a) shows the light module 1 in a top view. FIG. 1b) is a schematic depiction of the light distribution. FIG. 1c) shows a section of a cross sectional view of a light module 1 according to the invention. The light module 1 according to the invention is configured in the figure as a separate component, without this constituting a restriction. Three SIDE LEDs 4i, 4j, 4k as well as additional electronic components 5 are arranged on a circuit carrier 2 having a power supply circuit 3. The power supply circuit 3 serves to connect the circuit carrier 2 to an interface that is arranged at a distance from the circuit carrier and that leads to connection means to establish a connection to a source of current/voltage and/or to a control unit.

According to the invention, the circuit carrier 2 and the power supply circuit 3 are made of the same material and configured in one piece, and they are formed by a flexible printed circuit board. In the embodiment of the invention shown, the arrangement of the SIDE LEDs 4i, 4j, 4k on the circuit carrier 2 is adapted to the contour of the surface that is to be lit, here a triangle, without this constituting a restriction. FIG. 1b) schematically shows the light cones 7i, 7j, 7k emitted by the light sources. In order to set the radiation angle of the light, there is at least one optical waveguide 6 that, in the embodiment shown, completely fills the triangular surface between the SIDE LEDs 4i, 4j, 4k and seals them as well as the circuit carrier 2 towards the outside. The penetration of dust and other dirt is thus effectively prevented.

In the figures, it can be seen that the circuit carrier 2, the SIDE LEDs 4i, 4j, 4k and the additional components 5 as well as the optical waveguide 6 have a flat, sandwich-like structure.

In the embodiment shown, the power supply circuit 3 is configured as a strip-shaped printed conductor (flex tail).

Figure 2:
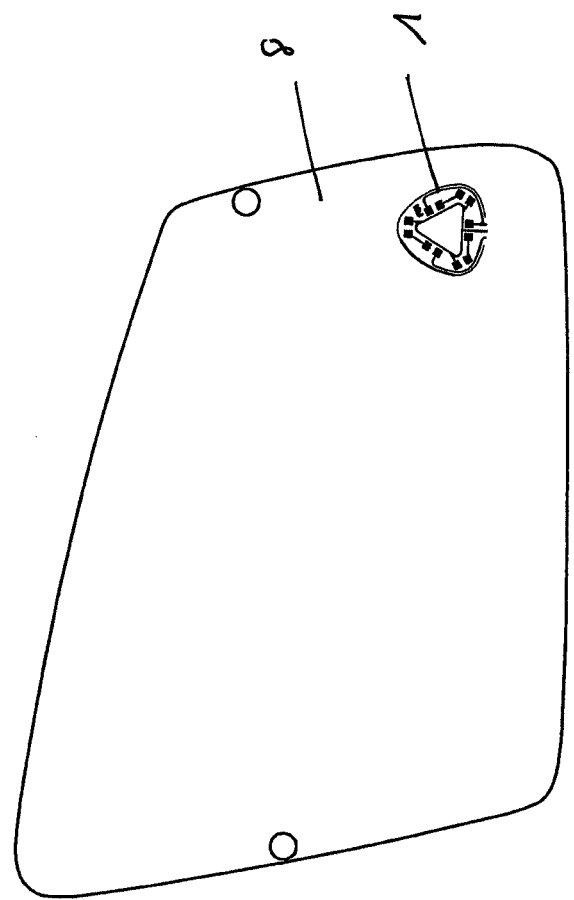
FIG. 2 shows a schematic depiction in a top view of a light module according to the invention, which is integrated into a heating film.

FIG. 2 shows a surface heating film 8 whose outer contour is adapted to the outer contour of a mirror glass surface of a rearview mirror in order to heat said mirror glass surface. However, the use of a surface heating film 8 in the present embodiment is only given by way of example. This could equally well be a flexible printed circuit board for an antenna function or some other light function or a cable set or another function. In this embodiment, the light module or the circuit carrier 2 of the light module 1 is integrated into the heating film 8.

Figure 3:
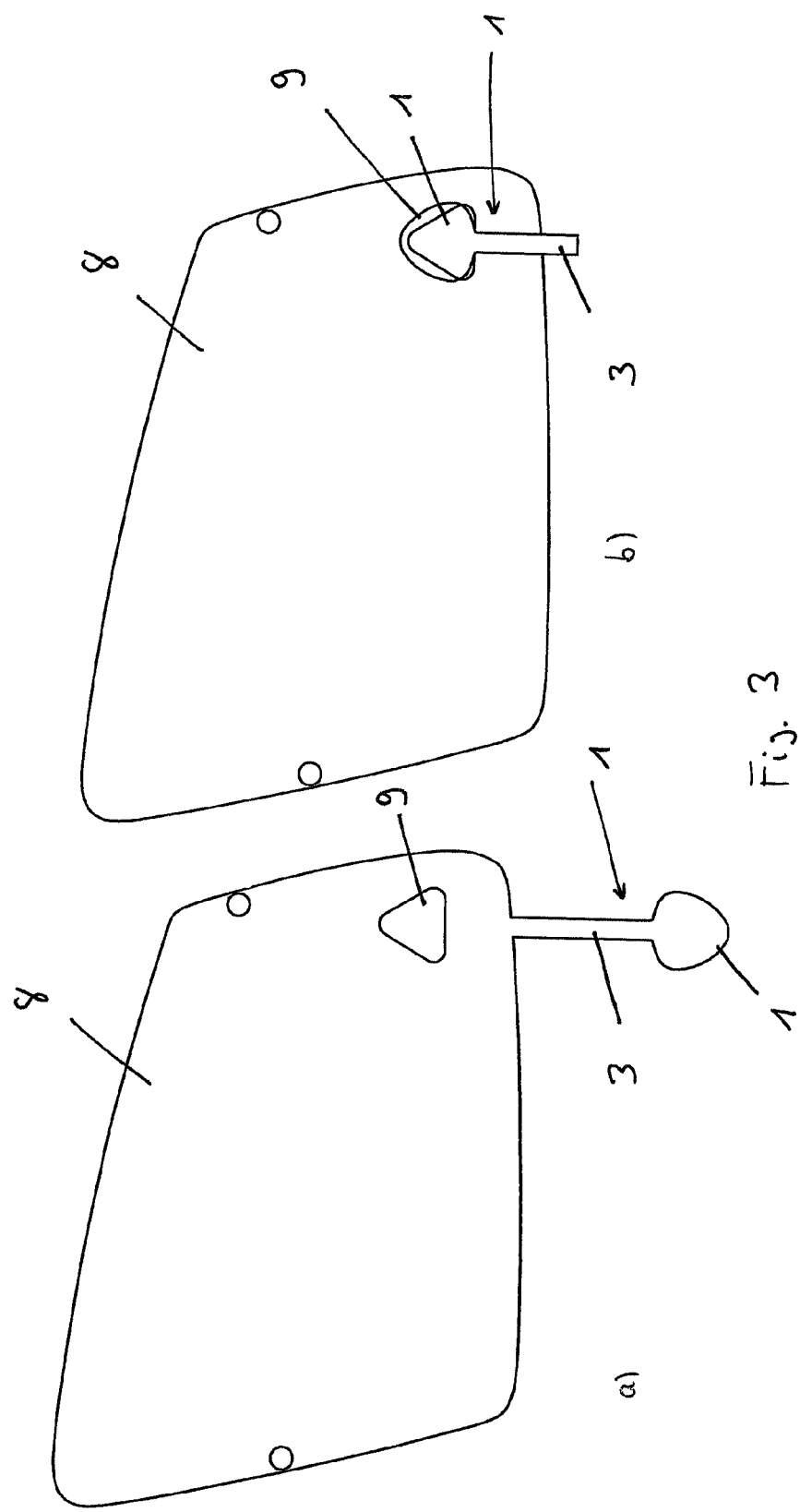
FIGS. 3a and 3b show a schematic depiction in a top view of a light module according to the invention, which is integrated into the edge area of a heating film.

In the embodiment of the invention shown in FIG. 3, the circuit carrier 2 with the strip-shaped printed conductor 3 is likewise an integral part of the heating film 8. The strip-shaped printed conductor 3 and the circuit carrier 2, however, extend towards the outside away from the edge of the heating film, so that the circuit carrier 2 can only be brought into the area of the signal display window of the rearview mirror by folding the strip-shaped printed conductor 3 over. The heating film 8 has a recess 9 in the area of the signal display window.

Figure 4:
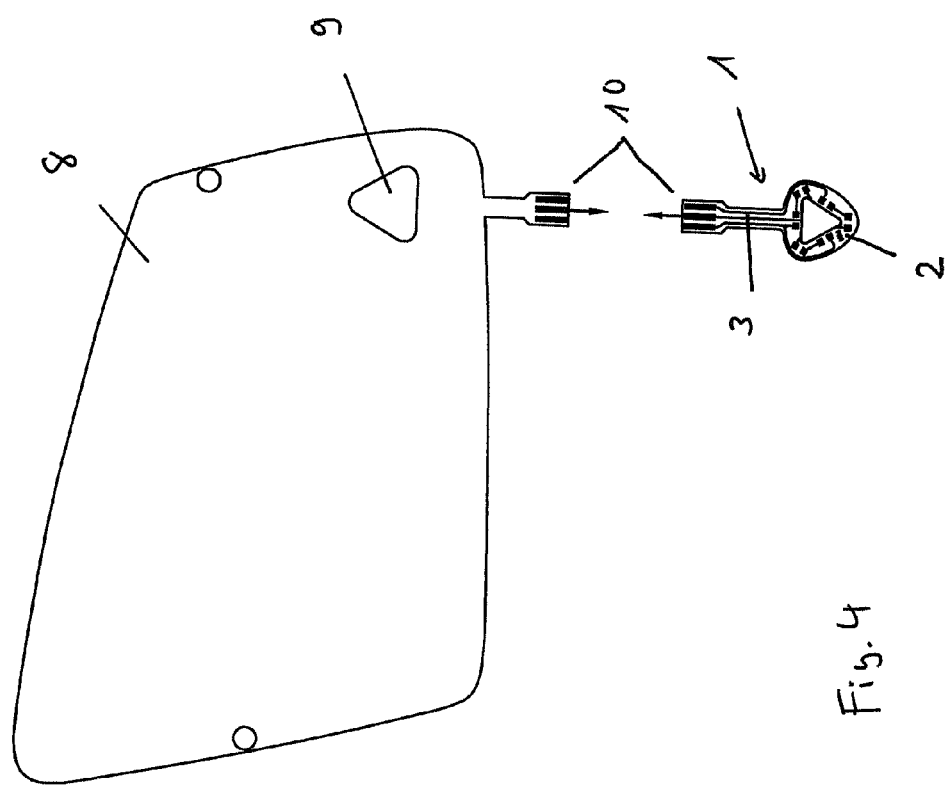
FIG. 4 shows the light module according to FIG. 3, with an interface to the heating film.

FIG. 4 shows an interface 10 between the heating film and the strip-shaped printed conductor 3 with the circuit carrier 2. In this embodiment as well, the light module is configured as a separate component.

FIG. 5 shows an embodiment of a light module 1 according to an embodiment of the invention in which the circuit carrier 2 with the light sources, here TOP LEDs 11i, 11j, 11k, are integrated into the heating film 8, but arranged at a distance from the signal display window of the rearview mirror. The optical elements, i.e. the optical waveguide 6 and the diffuser film 12, are arranged at a distance above the light sources.

While the invention has been particularly shown and described with reference to preferred embodiments thereof, it will be understood by those skilled in the art that various changes in form and details may be made therein without departing from the spirit and scope of the invention.

What is claimed is:

1. A light module for displaying a signal in a rearview mirror of a motor vehicle, the light module comprising:
   a circuit carrier;
   at least one light source disposed on the circuit carrier;
   a power supply circuit for connecting the circuit carrier to an interface that is disposed at a distance from the circuit carrier and leads to at least one of a control unit and a current or voltage source, the power supply circuit and the circuit carrier being made of a same material, being configured in one piece and being formed by a flexible printed circuit board, wherein, in an area of the power supply circuit, the flexible printed circuit board includes a strip-shaped printed conductor; and
   at least one additional flexible printed circuit board having at least one extra function, wherein the circuit carrier and the strip-shaped printed conductor project toward an outside away from an edge of the at least one additional flexible printed circuit board, the circuit carrier and the strip-shaped printed conductor being configured to be disposed in a desired position by folding or bending over the strip-shaped printed conductor.

2. The light module recited in claim 1, further comprising at least one additional electronic component disposed on the circuit carrier.

3. The light module recited in claim 1, wherein the at least one light source includes at least one of a SIDE LED and a TOP LED.

4. The light module recited in claim 1, wherein the at least one light source includes a plurality of light sources that are arranged on the circuit carrier so as to correspond to a contour of a surface configured to be lit by the light module.

5. The light module recited in claim 1, further comprising at least one light-forming element configured to set a radiation angle of light from the at least one light source.

6. The light module recited in claim 5, wherein the circuit carrier, the at least one light source and the at least one light forming element have a flat, sandwich-like structure.

7. The light module recited in claim 6, wherein the at least one light-forming element seals the at least one light source and the circuit carrier toward an outside.

8. The light module recited in claim 1, further comprising a diffuser configured to scatter light from the light module.

9. The light module recited in claim 1, wherein a surface configured to be lit by the at least one light source includes a mask for generating a desired symbol.

10. The light module recited in claim 1, wherein the circuit carrier is integrated into the at least one additional flexible printed circuit board.

11. The light module recited in claim 1, further comprising an interface disposed between the flexible printed circuit board and the strip-shaped printed conductor.

12. The light module recited in claim 1, the at least one additional flexible printed circuit board includes a recess, the circuit carrier being configured to be disposed in an area of the recess by folding over the strip-shaped printed conductor.

13. The light module recited in claim 1, wherein the additional function of the at least one additional flexible printed circuit board includes at least one of a heating function, an antenna function, a current-conduction function and another light function.

14. A rearview mirror for motor vehicles, the rearview mirror comprising:
a light module including:
a circuit carrier;
at least one light source disposed on the circuit carrier; and
a power supply circuit for connecting the circuit carrier to an interface that is disposed at a distance from the circuit carrier and leads to at least one of a control unit and a current or voltage source, the power supply circuit and the circuit carrier being made of a same material, being configured in one piece and being formed by a flexible printed circuit board, wherein, in an area of the power supply circuit, the flexible printed circuit board includes a strip-shaped printed conductor; and
at least one additional flexible printed circuit board having at least one extra function, wherein the circuit carrier and the strip-shaped printed conductor project toward an outside away from an edge of the at least one additional flexible printed circuit board, the circuit carrier and the strip-shaped printed conductor being configured to be disposed in a desired position by folding or bending over the strip-shaped printed conductor.

15. The rearview mirror recited in claim 14, further comprising a mirror glass surface, the light module being disposed directly underneath the mirror glass surface.

16. The rearview mirror recited in claim 14, wherein the light module is disposed in a base of the rearview mirror.

17. The rearview mirror recited in claim 14, wherein the light module is configured to show a blind spot.

* * * * *